(12) United States Patent
Sumiyoshi et al.

(10) Patent No.: US 11,397,546 B2
(45) Date of Patent: Jul. 26, 2022

(54) MEMORY SYSTEM

(71) Applicant: Kioxia Corporation, Minato-ku (JP)

(72) Inventors: Masato Sumiyoshi, Yokohama (JP); Keiri Nakanishi, Kawasaki (JP); Takashi Miura, Yokohama (JP); Kohei Oikawa, Kawasaki (JP); Daisuke Yashima, Tachikawa (JP); Sho Kodama, Kawasaki (JP); Youhei Fukazawa, Kawasaki (JP); Zheye Wang, Kawasaki (JP)

(73) Assignee: Kioxia Corporation, Minato-ku (JP)

( * ) Notice: Subject to any disclaimer, the term of this patent is extended or adjusted under 35 U.S.C. 154(b) by 86 days.

(21) Appl. No.: 16/942,112

(22) Filed: Jul. 29, 2020

(65) Prior Publication Data

US 2021/0294525 A1 Sep. 23, 2021

(30) Foreign Application Priority Data

Mar. 18, 2020 (JP) .............................. JP2020-047456

(51) Int. Cl.
*G06F 3/06* (2006.01)
*H03M 7/30* (2006.01)
*G11C 16/04* (2006.01)

(52) U.S. Cl.
CPC .......... *G06F 3/0673* (2013.01); *G06F 3/0604* (2013.01); *G06F 3/0659* (2013.01); *H03M 7/3086* (2013.01); *G11C 16/0483* (2013.01)

(58) Field of Classification Search
CPC ... G06F 12/0246; G06F 12/0292; H03M 7/34
See application file for complete search history.

(56) References Cited

U.S. PATENT DOCUMENTS

| | | | |
|---|---|---|---|
| 9,647,682 B1 | 5/2017 | Heng et al. | |
| 9,792,044 B2 | 10/2017 | Shih | |
| 2004/0036633 A1* | 2/2004 | Craft | H03M 7/3086 341/51 |
| 2014/0233376 A1* | 8/2014 | Yu | H04W 28/06 370/230 |
| 2017/0024278 A1* | 1/2017 | Twitto | G11C 29/52 |
| 2017/0187388 A1 | 6/2017 | Satpathy et al. | |
| 2018/0091170 A1* | 3/2018 | Asami | G11C 11/5642 |
| 2019/0052284 A1 | 2/2019 | Itani | |
| 2019/0188127 A1* | 6/2019 | Lee | G06F 12/0246 |
| 2019/0286522 A1* | 9/2019 | Bhatia | G06F 11/1076 |

* cited by examiner

*Primary Examiner* — Getente A Yimer
(74) *Attorney, Agent, or Firm* — Oblon, McClelland, Maier & Neustadt, L.L.P.

(57) ABSTRACT

A memory system including a storage device and a memory controller controlling the storage device and decoding an encoded data. The memory controller including: a history buffer storing a decoded data string; a history buffer read controller executing a read request to the history buffer; a decode executing section generating a first shaped data string based on the decoded data string read from the history buffer, generating a second shaped data string by referring the first shaped data string before the first shaped data string being written back to the history buffer in response to the read request, and generating a decoded result using the first shaped data string and the second shaped data string.

17 Claims, 14 Drawing Sheets

MEMORY SYSTEM

CROSS REFERENCE TO RELATED APPLICATIONS

This application is based upon and claims the benefit of priority from the prior Japanese Patent Application No. 2020-047456 filed on Mar. 18, 2020, the entire contents of which are incorporated herein by reference.

FIELD

One embodiment of the present disclosure relates to a memory system comprising a non-volatile memory.

BACKGROUND

In recent years, memory systems equipped with non-volatile memories have become widely used. As such the memory systems, a solid state drive (SSD) having NAND flash memories is known.

When data are compressed in such the memory systems described above, a dictionary coder is used to replace an input data string, which is a compression target, with a reference information for a stored input data string which has previously been input. In the memory systems that the dictionary coder is used, a decompression technique is used to decompress a compressed data string with the reference information for a decoded data string.

DETAILED DESCRIPTION

Figure 1:
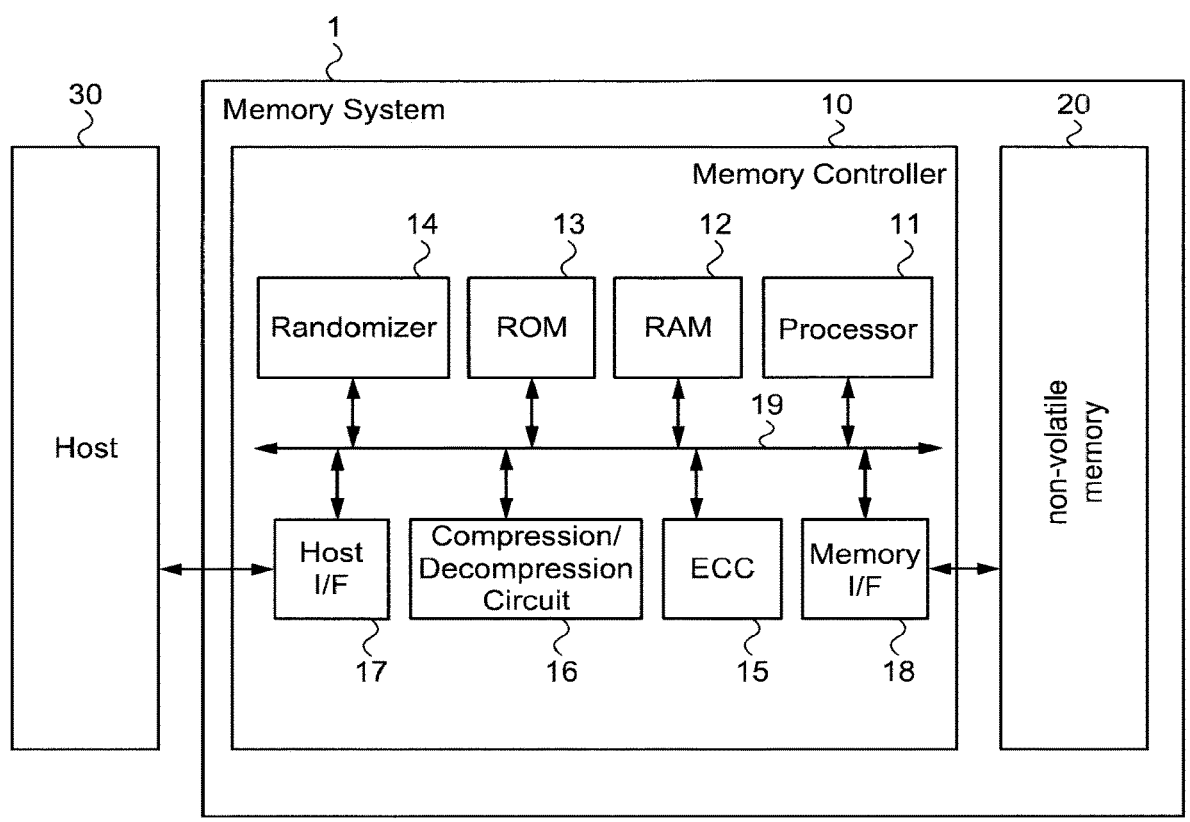
FIG. 1 is a block diagram illustrating a configuration of a memory system according to an embodiment.

A memory system according to an embodiment of the present disclosure improves decompression performance of a compression/decompression circuit.

A memory system in the embodiment according to the present disclosure includes a storage device and a memory controller controlling the storage device and decoding an encoded data. The memory controller including: a history buffer storing a decoded data string; a history buffer read controller executing a read request to the history buffer; a decode executing section generating a first shaped data string based on the decoded data string read from the history buffer, generating a second shaped data string by refferring the first shaped data string before the first shaped data string being written back to the history buffer in response to the read request, and generating a decoded result using the first shaped data string and the second shaped data string.

Hereinafter, the memory system according to an embodiment is described in detail with reference to the drawings. In the following description, components having substantially the same functions and configurations are denoted by the same reference numerals, and duplicate descriptions are given only when necessary. Each of the embodiments described below exemplifies an apparatus and a method for embodying a technical idea of this embodiment. The technical idea of the embodiment is not specified as materials, shapes, structures, arrangements, and the like of the constituent parts described below. Various modifications may be made to the technical idea of the embodiment in addition to the scope of the claims.

In the following explanation, information of 1 Byte is referred to as "data", and information arranged in the order in which the data are input is referred to as "data string". However, "data" is not limited to the information of 1 Byte. "Compressing" means reducing the amount of information (e.g., the numbers of bit) of the target data string, and may be referred to as "encoding". "Decompressing" means restoring the compressed data string to its uncompressed condition, and may also be referred to as "decoding".

When compressing a data string, an object that the data string of a compression target is replaced with information indicating a position and information relating to a length of data string is called a "symbol". The information relating the position indicates a position where a data string which is the same data string as the data string of the compression target is appeared in the past. The information relating to the length indicates a length of a data string which matches the data string of the compression target in a pattern of the data string in the past. For example, the symbol includes "location information" indicating an address in the history buffer that the decoded data string is stored, and "length information" indicating the number of data from a start position of the data string stored in the address.

Figure 2:
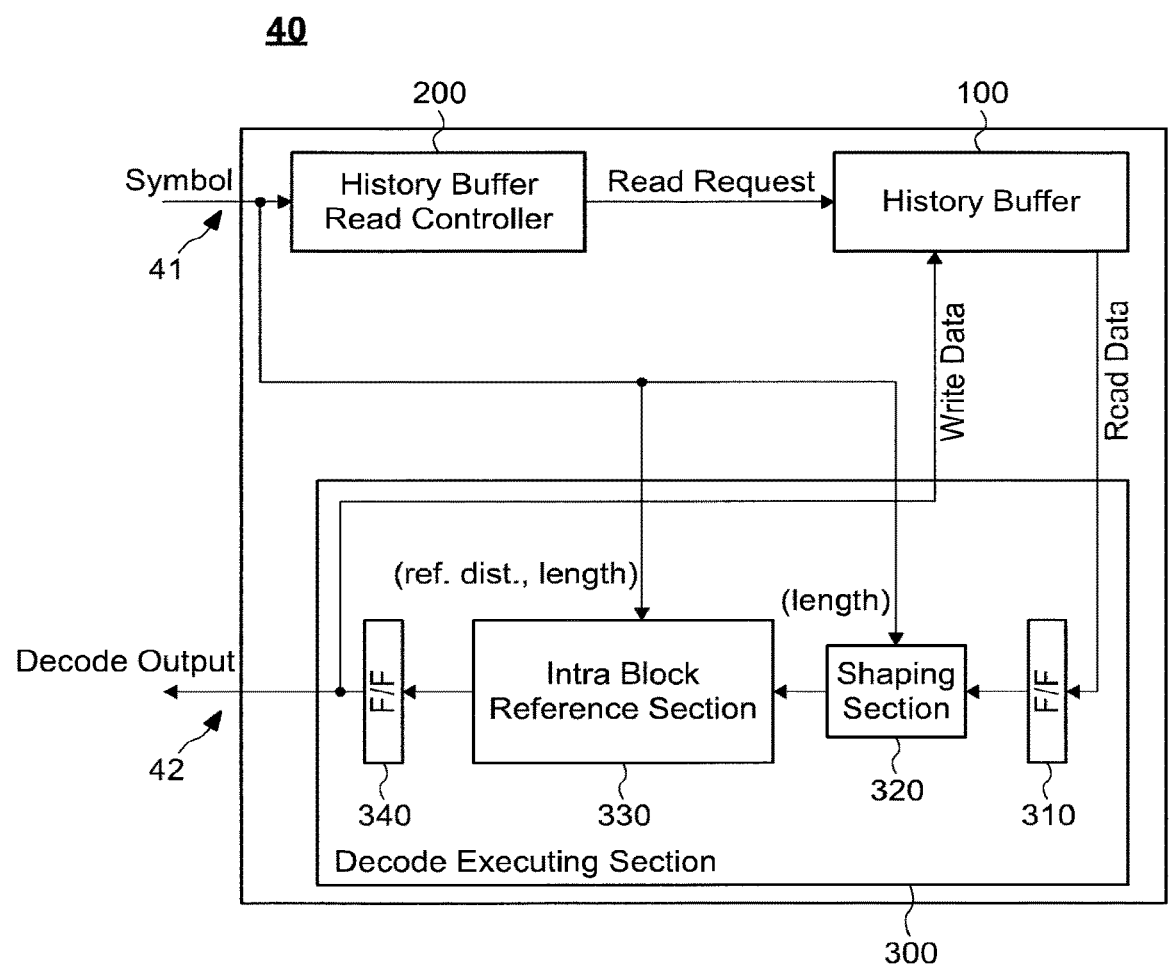
FIG. 2 is a block diagram illustrating a configuration of a decompression circuit according to an embodiment.

"Decoded data string" refers to a data string output to an output terminal 42 of a decompression circuit 40 from an output buffer 340 (F/F) of a decode executing section 300, and a data string written to a history buffer 100 or read from the history buffer 100 (refer to FIG. 2). "Shaped data string" refers to a data string which is shaped by shaping section and which is a data string before being input to the output buffer 340. A data string that a process has been completed by an intra block reference section 330 and a data string which has been output from the output buffer 340 among the decoded data string may be called a decoded result.

"One-cycle period" refers to a period in which the decode executing section 300 decodes and outputs a data string read from the history buffer 100. Each process of a process in which a history buffer read controller 200 executes a read request to the history buffer 100, a process in which the data string read from the history buffer 100 is input to the decode executing section 300 in response to a read request from the history buffer read controller 200, and a process in which the decoded result output from the decode executing section 300 is written back to the history buffer 100 are performed during the one-cycle period mentioned above. When referring to a first cycle and a second cycle, it means that the second cycle is a cycle immediately after the first cycle.

First Embodiment

The memory system according to a first embodiment is described. The memory system according to the first embodiment includes, for example, a NAND flash memory as a semiconductor memory device and a memory controller controlling the NAND flash memory. In this embodiment, the memory controller has a function decompressing the compressed data.

[Overall Configuration of Memory System 1]

FIG. 1 is a block diagram illustrating a configuration of a memory system according to an embodiment. As illustrated in FIG. 1, a memory system 1 includes a memory controller 10 and a non-volatile memory 20. The memory system 1 is connectable to a host 30. In FIG. 1, a state in which the memory system 1 and the host 30 are connected is shown. The host 30 is, for example, an electronic device such as a personal computer or a portable terminal.

The non-volatile memory 20 is a non-volatile memory that stores data in a nonvolatile manner, and is, for example, a NAND flash memory (hereinafter, simply referred to as a NAND memory). In the following explanation, the NAND memory is used as the non-volatile memory 20. However, the semiconductor memory device other than the NAND memory such as a three-dimensional flash memory, ReRAM (Resistance Random Access Memory), or FeRAM (Ferroelectric Random Access Memory) can be used as the non-volatile memory 20. It is not essential that the non-volatile memory 20 be the semiconductor memory device. The present embodiment can be applied to various storage media other than the semiconductor memory device.

The memory system 1 may be a memory card or the like in which the memory controller 10 and the non-volatile memory 20 are configured as a single package, or may be an SSD (Solid State Drive), or the like.

The memory controller 10 is, for example, a semiconductor integrated circuit configured as a SoC (System-On-a-Chip). Some or all of the operations of the respective components of the memory controller 10 described below are realized by hardware, but may be realized by executing firmware by a CPU (Central Processing Unit).

The memory controller 10 controls writing to the non-volatile memory 20 in accordance with a write request from the host 30 and controls reading from the non-volatile memory 20 in accordance with a read request from the host 30. The memory controller 10 includes a processor 11, a RAM (Random Access Memory) 12, a ROM (Read Only Memory) 13, a randomizer 14, an ECC circuit 15, a compression/decompression circuit 16, a host I/F (host interface) 17, and a memory I/F (memory interface) 18. These functional blocks are interconnected by an internal bus 19.

The compression/decompression circuit 16 operates as an encoder compressing data to be written to the non-volatile memory 20. The compression/decompression circuit 16 also operates as a decoder decompressing data read from the non-volatile memory 20. Detailed configuration and operation of the compression/decompression circuit 16 are described later.

The host I/F 17 performs operations according to the interface standard between the host 30 and the host I/F 17. The host I/F 17 outputs the request received from the host 30 and data to be written to the internal bus 19. The host I/F 17 transmits data read from the non-volatile memory 20 and decompressed by the compression/decompression circuit 16 to the host 30, and transmits responses from the processor 11 to the host 30.

The memory I/F 18 performs a write operation to non-volatile memory 20 according to the instructions from the processor 11. The memory I/F 18 performs a read operation from the non-volatile memory 20 according to the instructions from the processor 11.

The processor 11 is a control section that comprehensively controls each functional block of the memory system 1. When the processor 11 receives a request from the host 30 through the host I/F 17, the processor 11 performs control in response to the request. For example, the processor 11 instructs the memory I/F 18 to write data to the non-volatile memory 20 in response to the write request from the host 30. The processor 11 instructs the memory I/F 18 to read data from the non-volatile memory 20 in response to the read request from the host 30.

When the processor 11 receives the write request from the host 30, the processor 11 determines the storage area (memory area) on the non-volatile memory 20 for the data to be stored in RAM 12. That is, the processor 11 manages address to which data is written. A correspondence relationship between a logical address of the data received from the host 30 and a physical address indicating the storage area on the non-volatile memory 20 in which the data are stored is stored as an address conversion table.

When the processor 11 receives the read request from the host 30, the processor 11 converts the logical address specified by the read request to the physical address using address conversion table described above, and instructs the memory I/F 18 to read from the physical address.

In the NAND memory, generally, data are written and read in units of data called pages, and erased in units of data called blocks. A plurality of memory cells connected to the same word line are called memory cell group. In the case where the memory cell is an SLC (Single Level Cell), one memory cell group corresponds to one page. In the case where the memory cell is a multi-bit cell such as an MLC, a TLC, or a QLC, one memory cell group corresponds to a plurality of pages. Each memory cell is connected to both the word line and a bit line. Thus, each memory cell can identify using an address identifying the word line and an address identifying the bit line.

The RAM 12 is used, for example, as a data buffer and temporarily stores data received from the host 30 until the memory controller 10 stores the data to the non-volatile memory 20. The RAM 12 temporarily stores the data read from the non-volatile memory 20 until it is transmitted to the host 30. For example, the RAM 12 can be used as a general purpose memory, such as an SRAM (Static Random Access Memory) or a DRAM (Dynamic Random Access Memory).

The RAM 12 may be used as a working memory storing various management tables such as an address conversion table, a master table (snapshot) that is read from a particular area of the non-volatile memory 20 and developed at a time of activation or the like, or log information which is a change difference in various management tables.

The ROM 13 records various programs, parameters, and the like to operate the memory controller 10. The programs, parameters, and the like stored in the ROM 13 are read and executed by the processor 11 as required.

The Randomizer 14 includes, for example, a linear feedback shift register and the like, and generates a pseudo-random number uniquely obtained with respect to the inputted seed values. For example, the pseudo-random number generated by randomizer 14 is calculated an exclusive OR with the write data in the processor 11. Accordingly, the write data to be written to the non-volatile memory 20 is randomized.

The data transmitted from the host 30 is transferred to the internal bus 19 and temporarily stored in RAM12. The data are compressed by the compression/decompression circuit 16 and performed an error correction encoding by the ECC circuit 15. Then, the data are written to non-volatile memory 20 via memory UF 18. On the other hand, the data read from the non-volatile memory 20 is performed an error correction decoding by the ECC circuit 15. Thereafter, the data are decompressed by the compression/decompression circuit 16 to restore the original data. The restored data are, for example temporarily stored in RAM12 and then transferred to the host 30 via host I/F 17. The data encoded by the compression/decompression circuit 16 and/or the ECC circuit 15 may include a control data or the like used in the memory controller 10, in addition to the data described above.

In the write process according to the memory system 1 having the above-described configuration, the processor 11 instructs the compression/decompression circuit 16 to compress the data when the data are written to the non-volatile memory 20. At this time, the processor 11 determines the storage location (storage address) of the write data in the non-volatile memory 20, and instructs the memory I/F 18 the determined storage location. The compression/decompression circuit 16 compresses the data on the RAM 12 based on the instruction from the processor 11. Further, the ECC circuit 15 ECC decodes the compressed data on the RAM 12 based on the instruction from the processor 11. The generated write data are written via the memory I/F 18 to a specified storage location in the non-volatile memory 20. As an encoding method of the ECC circuit 15, for example, an encoding method using an LDPC (Low-Density Parity-Check) code, a BCH (Bose-Chaudhuri-Hocquenghem) code, or an RS (Reed-Solomon) code can be adopted.

On the other hand, in the read process, when the processor 11 reads from the non-volatile memory 20, processor 11 specifies an address on the non-volatile memory 20 and instructs the memory I/F 18 to read. The processor 11 instructs the ECC circuit 15 to start ECC decoding, and also instructs the compression/decompression circuit 16 to start decompressing. The memory I/F 18 executes a read to the specified addresses of the non-volatile memory 20 in accordance with the instruction from the processor 11, and inputs the read data obtained by the read process to the ECC-circuit 15. The ECC circuit 15 ECC decodes the input read data. The compression/decompression circuit 16 decompress the ECC decoded data. When this decompression is successful, the processor 11 stores the decompressed originals in the RAM 12. On the other hand, when the ECC decoding and decompression fail, the processor 11, for example, notifies the host 30 of a read error.

[Configuration of Decompression Circuit 40]

In the compression/decompression circuit 16, a compression technique using a dictionary coder using a similarity of data string, such as the LZ77 compression, is used. The data string which is the compression target is compressed to a symbol by a compression function provided in the compression/decompression circuit 16. The symbol is information that refers to a stored input data string previously input. A decompression function provided in the compression/decompression circuit 16 decompresses the compressed data string based on the decoded data string previously decompressed and the symbols. As described above, the symbol includes "location information" indicating an address in the history buffer 100 and "length information" indicating the number of data from the start position of data string stored in the address. In the following description, a decompression circuit 40 having a decompression function of the compression/decompression circuit 16 is described. Since a common circuit can be used as the compression circuit with the compression function of the compression/decompression circuit 16, the descriptions thereof are omitted.

FIG. 2 is a block diagram illustrating the configuration of a decompression circuit according to an embodiment. As shown in FIG. 2, the decompression circuit 40 includes a history buffer 100, a history buffer read controller 200, a decode executing section 300, an input terminal 41 and an output terminal 42. The decode executing section 300 includes an input buffer 310 (F/F), a shaping section 320, an intra block reference section 330, and an output buffer 340.

The history buffer 100 stores a decoded data string in the order in which the previously decoded data were written (in the order in which they were written back). That is, the history buffer 100 stores the decoded data string has been decoded in a cycle prior to a cycle in which the target decode data string is processed. The history buffer 100 stores, for example, several kilobytes to several ten kilobytes of decoded data. The history buffer 100 is a buffer having a flip-flop configuration based on a ring buffer policy. The history buffer 100 has a configuration in which address can be specified in bytes, and can process a plurality of read requests and write requests. The history buffer 100 may include an SRAM.

An input terminal of the history buffer read controller 200 is connected to the input terminal 41 of the decompression circuit 40. An output terminal of the history buffer read controller 200 is connected to the input terminal of the history buffer 100. An input terminal of the history buffer 100 is connected to the output terminal of an output buffer 340 in addition to the output terminal of the history buffer read controller 200. An output terminal of the history buffer 100 are connected to an input terminal of the input buffer 310. An output terminal of the input buffer 310 is connected to an input terminal of the shaping section 320. The input terminal of the shaping section 320 is connected to the input terminal 4 in addition to the output terminal of the input buffer 310. An output terminal of the shaping section 320 is connected to an input terminal of the intra block reference section 330. The input terminal of the intra block reference section 330 is connected to the input terminal 41 in addition to the output terminal of the shaping section 320. An output terminal of the intra block reference section 330 is connected to an input terminal of the output buffer 340. An output terminal of the output buffer 340 is connected to the output terminal 42 in addition to the input terminal of the history buffer 100.

The symbol is input to the history buffer read controller 200 via the input terminal 41. As mentioned above, the symbol includes the location information (ref. dist.), and the length information (length). The location information (ref. dist.) indicates the address in the history buffer 100 in which the decoded data string has been already stored. The length information (length) indicates the number of data from a start position of the decoded data string stored in the address. The symbol input to the input terminal 41 is transmitted to the history buffer read controller 200, the shaping section 320, and the intra block reference section 330. In the present embodiment, at least location information is transmitted to the history buffer read controller 200. At least length information is transmitted to shaping section 320. Both the location information and the length information are sent to the intra block reference section 330. However, the present invention is not limited to the above configuration. For example, the information transmitted to each of the history buffer read controller 200, the shaping section 320, and the intra block reference section 330 may be appropriately adjusted.

When receiving the symbol from the input terminal 41, the history buffer read controller 200 transmits a read request signal (Read Request) to the history buffer 100. The read request signal is a signal generated based on the symbol, which includes the location information. That is, the history buffer read controller 200 reads the decoded data string stored in the address of the history buffer 100 corresponding to the location information included in the symbol.

The history buffer 100 outputs the data (Read Data) read by the request from the history buffer read controller 200 to the input buffer 310. The input buffer 310 temporarily stores the decoded data string read from the history buffer 100 and input to the decode executing section 300. In the present embodiment, the configuration in which Read Data is directly transmitted from the history buffer 100 to the input buffer 310 is exemplified, but the present invention is not limited to this configuration. For example, the Read Data may be transmitted to the input buffer 310 via the history buffer read controller 200. Since the Read Data was stored in the history buffer 100, the data string configured by Read Data can be called the decoded data string. The input buffer 310 is, for example, a buffer having a flip-flop configuration. The input buffer 310 may include an SRAM.

Based on the length information included in the symbol, the shaping section 320 extracts a part of the decoded data string stored in the input buffer 310 and transmit to the intra block reference section 330. As described above, since the data string stored in the input buffer 310 is a data string in the address corresponding to the location information, the data string stored in the input buffer 310 matches the data string specified by the symbol at least a few data from the start position of the data string. The length information indicates a length of the data matches with the stored data string in the input buffer 310 and the data string specified by the symbol. The data string extracted and transferred by the shaping section 320 can be called a shaped data string. The shaping section 320 extracts the decoded data string stored in the input buffer 310 and transfers to the other circuits or functional sections, which may be referred to as "shaping data string". In other words, the shaping section 320 generates a shaped data string based on the decoded data string read from the history buffer 100.

The intra block reference section 330 refers to the shaped data string (a first shaped data string) and generates a second shaped data string after the first shaped data string is generated, before the shaped data string mentioned above is written back to the history buffer 100. In other words, the intra block reference section 330 refers to the first shaped data string and generates the second shaped data string prior to the decoded data string based on the first shaped data string generated by the shaping section 320 is output from the output buffer 340. The intra block reference section 330 generates a decoded result including the first shaped data string and the second shaped data string, and transmits to the output buffer 340. The output buffer 340 temporarily stores the decoded result. Based on the location information and the length information included in the received symbol, the intra block reference section 330 determines whether or not the data string should be referred to the first shaped data string that was previously generated. The output buffer 340 is, for example, a buffer having a flip-flop configuration. The output buffer 340 may include an SRAM.

The intra block reference section 330 refers to the first shaped data string and generates the second shaped data string as mentioned above instead of reading a data string from the history buffer 100 when the intra block reference section 330 refers to the first shaped data string which has been already shaped and determines that a data string needs to be generated (that is, there is a data string the same as the first shaped data string). The data string generated by the intra block reference section 330 is transmitted to the output buffer 340. The intra block reference section 330 transmits the shaped data string generated by the shaping section 320 without applying further modifications to the output buffer 340 in the case where the intra block reference section 330 determines that there is no data string to refer to the first shaped data string.

The first shaped data string and the second shaped data string stored in the output buffer 340 are output (Decode Output) as a decoded result to the output terminal 42, and the decoded result (or decoded data string) is written to the history buffer 100. That is, the output buffer 340 transmits a write data (Write Data) to the history buffer 100. In other words, the decode executing section 300 generates the decoded result using the first shaped data string and the second shaped data string, and writes back the decoded result to the history buffer 100. The term "write back" means writing the decoded result to the history buffer 100. The decoded result is output based on the symbol input to the input terminal 41 of the decompression circuit 40.

As described above, the decode executing section 300 refers to the first shaped data string read from the history buffer 100 and shaped to generate the second shaped data string that is the same data string as the first shaped data string within one cycle. In other words, the decode executing section 300 replicates the first shaped data string and generates the second shaped data string within one cycle.

[Configuration of Intra Block Reference Section 330]

Figure 3:
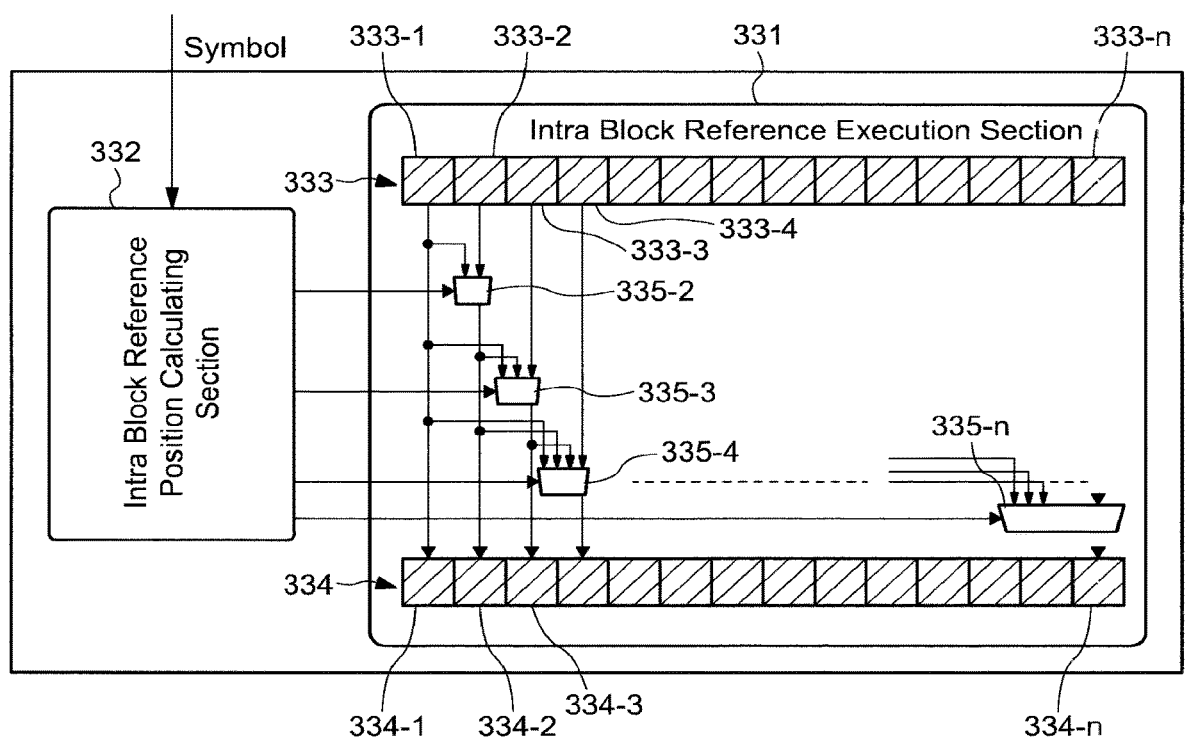
FIG. 3 is a block diagram illustrating a configuration of an intra block reference section of a decompression circuit according to an embodiment.

FIG. 3 is a block diagram illustrating a configuration of an intra block reference section of a decompression circuit according to an embodiment. As shown in FIG. 3, the intra block reference section 330 includes an intra block reference execution section 331 and an intra block reference position calculating section 332.

The intra block reference execution section 331 includes an input port 333, an output port 334, and a multiplexer 335. A shaped data string output from the shaping section 320 is input to the input port 333. A data string generated by the intra block reference section 330 and transmitted to the output buffer 340 is output to the output port 334. In this embodiment, the number of the input port 333 is the same as the number of the output port 334, but the number of the input port 333 may be less than or greater than the number of output port 334. In the present embodiment, the number of each of the input port 333 and the output port 334 is the same as the number of data of the output buffer 340, but the number of each of the input port 333 and the output port 334 may be smaller than or larger than the number of data of the output buffer 340.

In the following description, the first column, the second column, ..., the n-th column of the input port 333 are referred to as the input port 333-1, 333-2, ..., 333-n. However, if it is not necessary to distinguish each of the input port 333, it is simply referred to as an input port 333. The first column, the second column, ..., the n-th column of the output port 334 are referred to as the output port 334-1, 334-2, ..., 334-n. However, if it is not necessary to distinguish each of the output ports 334, it is simply referred to as an output port 334. The second column, the third column, ..., n-th column of the multiplexer 335 are referred to as multiplexer 335-2, 335-3, ..., 335-n. However, if it is not necessary to distinguish each of the multiplexers 335, it is simply referred to as a multiplexer 335.

The multiplexer 335 is arranged between the input port 333 and the output port 334. The multiplexer 335 is arranged on a line connecting the input port 333-n of the n-th column and the output port 334-n of the n-th column, except on a line connecting the input port 333-1 of the first column and the output port 334-1 of the first column. Each multiplexer 335 is connected to an output line of the multiplexer 335 in the column prior to the column in which the multiplexer 335 is arranged. For example, the input port 333-1 of the first column, the input port 333-4 of the fourth column, and the output lines of the multiplexers 335-2 to 335-3 of the second to third columns are connected to the input terminal of the multiplexer 335-4 of the fourth column. In other words, the input port 333-1 of the first column, the input port 333-n of the n-th column, and the output lines of the multiplexers 335-2 to 335-(n−1) of the second to (n−1)-th columns are connected to the input terminal of the multiplexer 335-n of the n-th column. That is, a data previously output to the output port 334 can be used as a subsequent output data of the output port 334.

The intra block reference position calculating section 332 is connected to and controls multiplexers 335-2 to 335-n. By this control, the data of the input ports 333 of the first to (n−1)-th columns can be replicated to the output port 334-n of the n-th column. For example, the input terminal of the multiplexer 335-3 of the third column is connected to the output lines of the input port 333-1 of the first column, the input port 333-3 of the third column, and the output line of the multiplexer 335-2 of the second column. Therefore, a data same as the data previously output to the input port 333-1 of the first column, the input port 333-3 of the third column, or the output port 334-2 of the second column is output to the output port 334-3 of the third column.

As described above, the intra block reference execution section 331 refers to the first shaped data string previously shaped to generate the second shaped data string. The intra block reference position calculating section 332 determines the location and length of the first shaped data string to be referenced. In other words, the intra block reference location calculating section 332 specifies the first shaped data string to be replicated.

[Decode Operation of Intra Block Reference Section 330]

Figure 4:
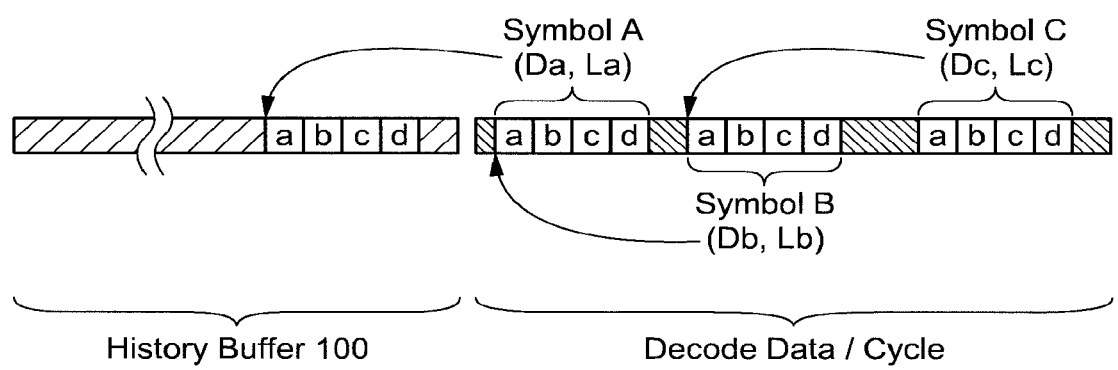
FIG. 4 is a conceptual diagram illustrating a decompression operation of a decompression circuit according to an embodiment.

FIG. 4 is a conceptual diagram illustrating a decode operation of a decompression circuit according to an embodiment. The decode operation of FIG. 4 is performed using the intra block reference section 330 of FIG. 3. FIG. 4 illustrates a case where a decoded result (Decode Data) including symbols A to C indicating a shaped data string "abcd" is output. The data string "abcd" is included in both the stored input data string and the shaped data string in the history buffer 100. As shown in FIG. 4, the three shaped data string shaped based on symbols A to C are shaped within one cycle. In other words, there are two or more identical shaped data string "abcd" in the same cycle.

The symbol A (location information, length information) is (Da, La). The location information Da is information indicating the distance from the data "a" of the start position of the data string "abcd" stored in the history buffer to a location of the symbol A as a reference location. The length information La is information indicating the number of data from the data "a" to the data "d". The symbol B (location information, length information) is (Db, Lb). The location information Db is information indicating the distance from the data "a" of the start position of data string "abcd" generated based on the symbol A to the location of the symbol B as a reference location. The length information Lb is information indicating the number of data items from the data "a" to the data "d" of the data string "abcd" generated based on the symbol A. The symbol C (location information, length information) are (Dc, Lc). The location information Dc is information indicating the distance from the data "a" of the start position of data string "abcd" generated based on the symbol B to the location of the symbol C as a reference location. The length information Lc is information indicating the number of data items from the data "a" to the data "d" of the data string "abcd" generated based on the symbol B.

The method of decoding the symbol A using the data string "abcd" stored in the history buffer is the same as that of the conventional method, so the explanation is omitted. The decompression of the symbol B using the data string "abcd" generated based on the symbol A is performed by the intra block reference section 330 shown in FIG. 3. Specifically, the multiplexer 335-j (not shown) of the j-th column arranged for the output port 334-j (not shown) of the j-th column corresponding to the data location of the symbol B in the multiplexer 335 of FIG. 3 is controlled. The data output to the output port 334-k (not shown) of the k-th column corresponding to the location information Db and the length information Lb is replicated and output to the output port 334-j (not shown) of the j-th column. The "j" and "k" are integers that are 1 or more and n or less. The decode of the symbol C using the data string "abcd" generated based on the symbol B is performed in the same manner as described above. The methods described above generate the decoded result including the data string generated based on each of the symbols A to C.

The above configuration can be described as follows, where the data string shaped based on the symbol A is a first shaped data string, the data string shaped based on the symbol B is a second shaped data string, and the data string shaped based on the symbol C is a third shaped data string. The intra block reference section 330 generates the second shaped data string by referring to the first shaped data string before the first shaped data string is written back to the history buffer 100. In addition, the intra block reference section 330 refers to the second shaped data string and generates the third shaped data string before the first shaped data string and the second shaped data string are written back to the history buffer 100. As described above, the intra block reference section 330 generates the decoded result using the first shaped data string, the second shaped data string, and the third shaped data string.

In conventional decode method, in order to shape a shaped data string based on a symbol (or decode based on a symbol), a decoded data string previously stored had to be written to the history buffer. That is, the decoded data string that can be used for the decode process needed to be decoded in a cycle prior to the cycle in which the decode process is performed. Therefore, even if there is a data string to be referenced in the same cycle, the decode could not be performed by referring to the data string in the same cycle. Even if the same data strings exist in the same cycle, the data string must be read from the history buffer each time that the data string is shaped.

Meanwhile, in the memory system 1 according to the first embodiment, a subsequent symbol can be shaped by referring to a data string previously shaped in the same cycle. Therefore, in the case where the same data strings exist in the same cycle, the subsequent symbol can be shaped by replicating the previously shaped data string without reading the data string from the history buffer 100. Consequently, the decompression performance of the decompression circuit 40 in the compression/decompression circuit 16 can be improved.

Second Embodiment

Figure 5:
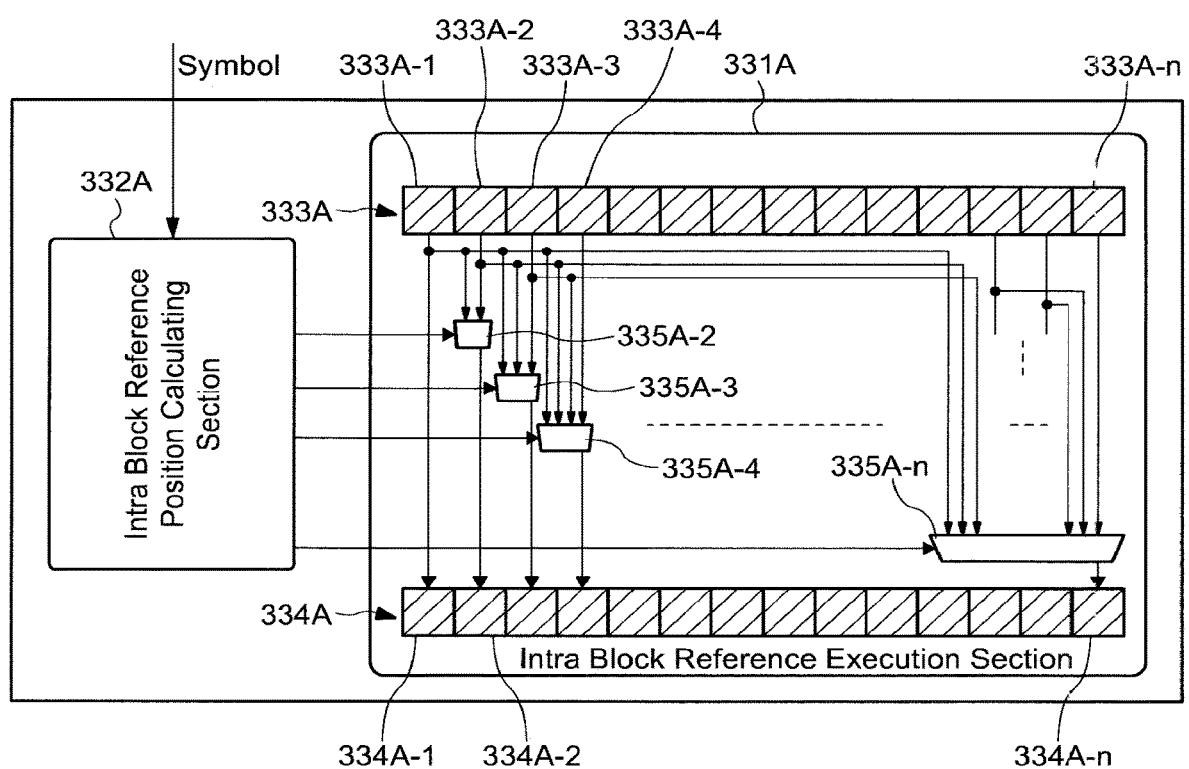
FIG. 5 is a block diagram illustrating a configuration of an intra block reference section of a decompression circuit according to an embodiment.

In the second embodiment, an intra block reference section 330A having a configuration similar to that of the intra block reference section 330 in the first embodiment is described. FIG. 5 is a block diagram illustrating the configuration of the intra block reference section of decompression circuit according to an embodiment. The intra block reference section 330A shown in FIG. 5 is similar to the intra block reference section 330 shown in FIG. 3, but a configuration of the intra block reference execution section 331A is different from the configuration of the intra block reference execution section 331 of FIG. 3. In the following description, descriptions of the same features as those of the configuration of FIG. 3 are omitted, and points mainly different from those of the configuration of FIG. 3 are described.

[Configuration of Intra Block Reference Section 330A]

As shown in FIG. 5, each multiplexer 335A is connected to an input port 333A of the column in which the multiplexer 335A is arranged, and to an input port 333A of the previous column. While the input terminal of the multiplexer (e.g., multiplexer 335-4) shown in FIG. 3 is connected to the output terminal of the other multiplexers (e.g., multiplexers 335-2 and 335-3), all input terminals of multiplexers (e.g., multiplexer 335A-3 of the third column) shown in FIG. 5 are connected to the input ports (e.g., input port 333A-1 to 3 of the first column to the third column). In other words, the input port 333A-1 to 333A-n of the first to n-th columns are connected to the input terminal of the multiplexer 335 A-n of the n-th column. That is, the data of a certain column input to the input port 333A can be used as a plurality of output data to be output to the output ports 334A.

[Decode Operation of Intra Block Reference Section 330A]

Figure 6:
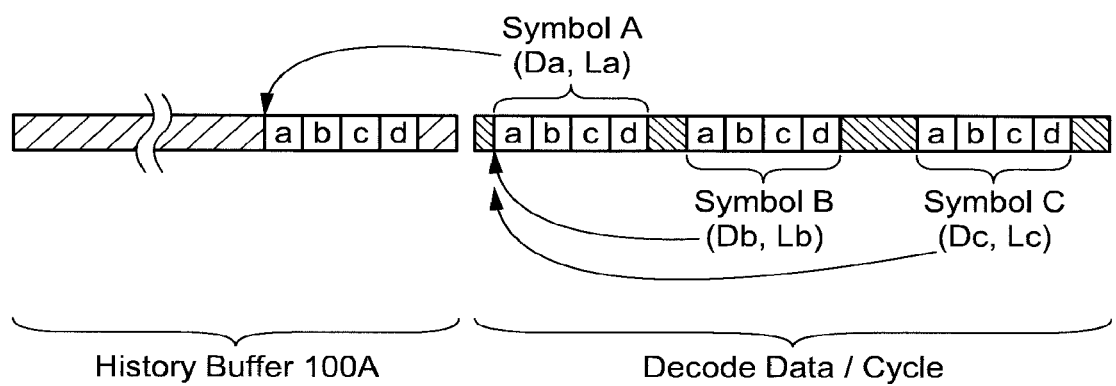
FIG. 6 is a conceptual diagram illustrating a decompression operation of a decompression circuit according to an embodiment.

FIG. 6 is a conceptual diagram illustrating a decode operation of a decompression circuit according to an embodiment. The decode operation of FIG. 6 is performed using the intra block reference section 330A of FIG. 5. Since the configuration shown in FIG. 6 is similar to the configuration shown in FIG. 4, descriptions of the same features as those of the configuration of FIG. 4 are omitted in the following description, and points mainly different from those of the configuration of FIG. 4 are described.

As shown in FIG. 6, the decode of the symbol B using the data string "abcd" generated based on the symbol A is performed by the intra block reference section 330A shown in FIG. 5. Specifically, the data of the input port 333A corresponding to the location information Db and the length information Lb and the data of the input port 333A corresponding to the location information Dc and the length information Lc are replicated and output to the respective output port 334A by controlling the multiplexer 335A-j (not shown) of the j-th column arranged for the output port 334A-j (not shown) of the j-th column corresponding to the data position of the symbol B in the multiplexer 335A of FIG. 5, and the multiplexer 335A-k (not shown) of the k-th column arranged for the output port 334A-k (not shown) of the k-th column corresponding to the data position of the symbol C in the multiplexer 335A of FIG. 5. The "j" and "k" are integers that are 1 or more and n or less. The methods described above generate the decoded result including the data string generated based on each of the symbols A to C.

The above configuration can be described as follows, where the data string shaped based on the symbol A is a first shaped data string, the data string shaped based on the symbol B is a second shaped data string, and the data string shaped based on the symbol C is a third shaped data string. In addition, the intra block reference section 330 generates the second shaped data string and the third shaped data string by referring to the first shaped data string before the first shaped data string is written back to the history buffer 100. As described above, the intra block reference section 330A generates the decoded result using the first shaped data string, the second shaped data string, and the third shaped data string.

As described above, according to the memory system 1A according to the second embodiment, the same effects as those of the memory system 1 according to the first embodiment can be obtained.

Third Embodiment

Figure 7:
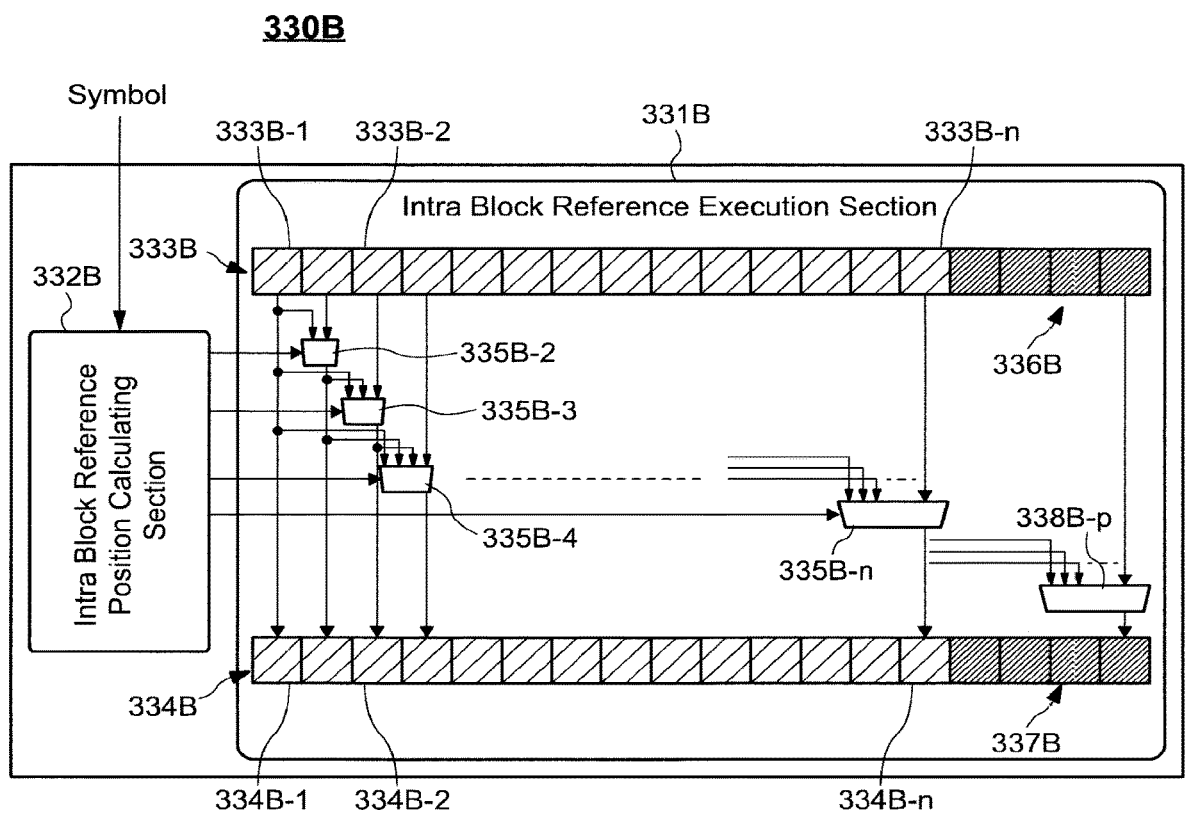
FIG. 7 is a block diagram illustrating a configuration of an intra block reference section of a decompression circuit according to an embodiment.

In the third embodiment, an intra block reference section 330B having a configuration similar to that of the intra block reference section 330 in the first embodiment is described. FIG. 7 is a block diagram illustrating the configuration of an intra block reference section of a decompression circuit according to an embodiment. The intra block reference section 330B shown in FIG. 7 is similar to the intra block reference section 330 shown in FIG. 3, but a configuration of the intra block reference execution section 331B is different from the configuration of the intra block reference execution section 331 of FIG. 3. In the following description, descriptions of the same features as those of the configuration of FIG. 3 are omitted, and points mainly different from those of the configuration of FIG. 3 are described.

[Configuration of Intra Block Reference Section 330B]

As shown in FIG. 7, the intra block reference execution section 331B has an excess input port 336B and an excess output port 337B in addition to an input port 333B and an output port 334B. The excess input port 336B is arranged adjacent to the input port 333B. In other words, the excess input port 336B is an extension part of the input port 333B. That is, the input port 333B and the excess input port 336B are configured by a series of consecutive input ports. The excess output port 337B is arranged adjacent to the output port 334B. In other words, the excess output port 337B is an extension part of the output port 334B. That is, the output port 334B and the excess output port 337B are configured by a series of consecutive output ports. A multiplexer 338B-p is arranged between the excess input port 336B and the excess output port 337B. The "p" is an integer greater than the "n". The multiplexer 338B-p has a configuration similar to the multiplexer 335B between the input port 333B and the output port 334B. In other words, an input terminal of the multiplexer 338B-p of the p-th column, an input port 333B-1 of the first column, output lines of the multiplexers 335B-2 to 335B-n of the second column to the n-th column, and output lines of the multiplexers 338B-(n+1) to 338B-(p−1) of the (n+1)-th to (p−1)-th column are connected. The number of the input port 333B and the output port 334B is the same as the number of data in the output buffer 340B.

[Decode Operation of Intra Block Reference Section 330B]

When the number of data in the decoded result is less than the number of data in the output buffer 340B or the same as the number of data in the output buffer 340B, data is transmitted and received only between the input port 333B and the output port 334B. On the other hand, when the number of data of the decoded result is greater than the number of data of the output buffer 340B, data is transmitted and received between first input ports (the input port 333B and the excess input port 336B) and second input ports (the output port 334B and excess output port 337B).

For example, when the number of bytes to be decompressed in one cycle is 10 bytes, the output buffer 340B is configured in 10 bytes (number of data is 10). In this configuration, the number of data of the input port 333B and the number of data of output port 334B is also 10. In the above cases, if there is data that needs to be decoded in the latter part or in the last data of one cycle, the decoded result may exceed 10 bytes. In such cases, since the number in each of the input port 333B and output port 334B is insufficient for the number of data decoded result, it is not possible to output all the decoded result to the output buffer 340B by transmitting and receiving data between the input port 333B and the output port 334B only. In order to compensate for this shortage, data is transmitted and received between the excess input port 336B and excess output port 337B.

Figure 8:
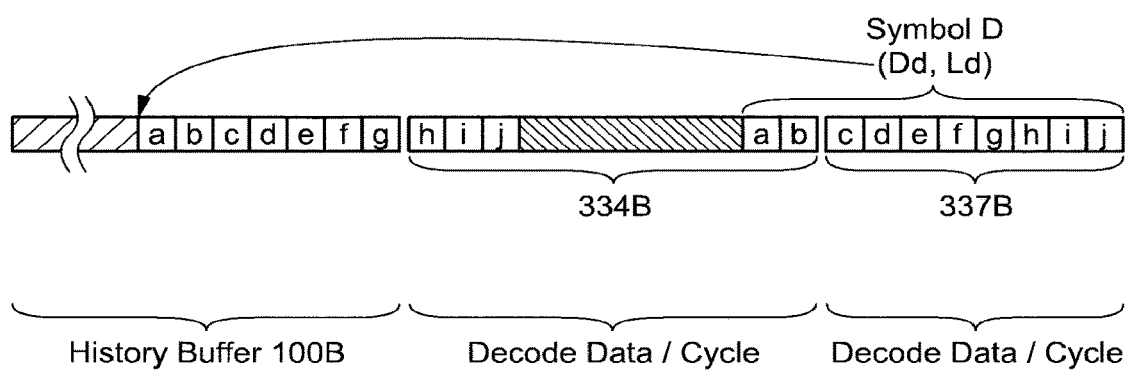
FIG. 8 is a conceptual diagram illustrating a decompression operation of a decompression circuit according to an embodiment.

FIG. 8 is a conceptual diagram for illustrating a decode operation of decompression circuit according to an embodiment. The decode operation shown in FIG. 8 is implemented by the intra block reference section 330B of FIG. 7. FIG. 8 illustrates a case where the decoded result including a symbol D indicating the shaped data string "hij . . . abcdefghij" is output. The data string "abcdefg" is stored at the end of the history buffer 100B. The data string "hij . . . ab" in the above shaped data string "hij . . . abcdefghij" is stored in the output port 334B, the data string "cdefghij" is stored in the excess output port 337B. That is, since the symbol D is present in the latter part of the output port 334B, the number of data of the shaped data string exceeds the number of data of the output port 334B, the section exceeding is stored in the excess output port 337B. Here, one part of data string that does not exceed the number of data in the output buffer 340B and is stored in the output port 334B is called "first decode data". Another part of data string that exceeds the number of data in the output buffer 340B is called "second decode data". In this embodiment, the second decode data is transmitted from the input buffer 310B to the output buffer 340B one or more cycles later from the present cycle, after the first decode data is transmitted from the input buffer 310B to the output buffer 340B. Then, the first decode data and the second decode data are combined to generate the decoded result.

The data string "abcdefg" in the shaped data string is shaped using the data string "abcdefg" stored in the history buffer 100B. The data string "hij" in the shaped data string is shaped by the intra block reference section 330B shown in FIG. 7. Specifically, the signal of the output line of the multiplexer 335B-r (not shown) of the r-th column corresponding to the position of the data string "hij" in the multiplexer 335B of FIG. 7 is selected by the multiplexer 338B-s of the s-th column arranged with respect to the column of the excess output port 337B, subsequently the data of the output port 334B-r (not shown) of the r-th column corresponding to the location information Dd and the length information Ld are replicated and output to the excess output port 337B-s of the s-th column. The "r" is an integer that is 1 or more and n or less. The "s" is an integer that is (n+1) or more and p or less.

As described above, the memory system 1B according to the third embodiment, even when the number of data items in the decoded result exceeds the number of data items in the output buffer 340B, shaping can be performed by referring to the shaped data string that has not been written back to the history buffer 100B. Consequently, the decompression performance of the decompression circuit 40B in the compression/decompression circuit 16B can be improved.

Fourth Embodiment

Figure 9:
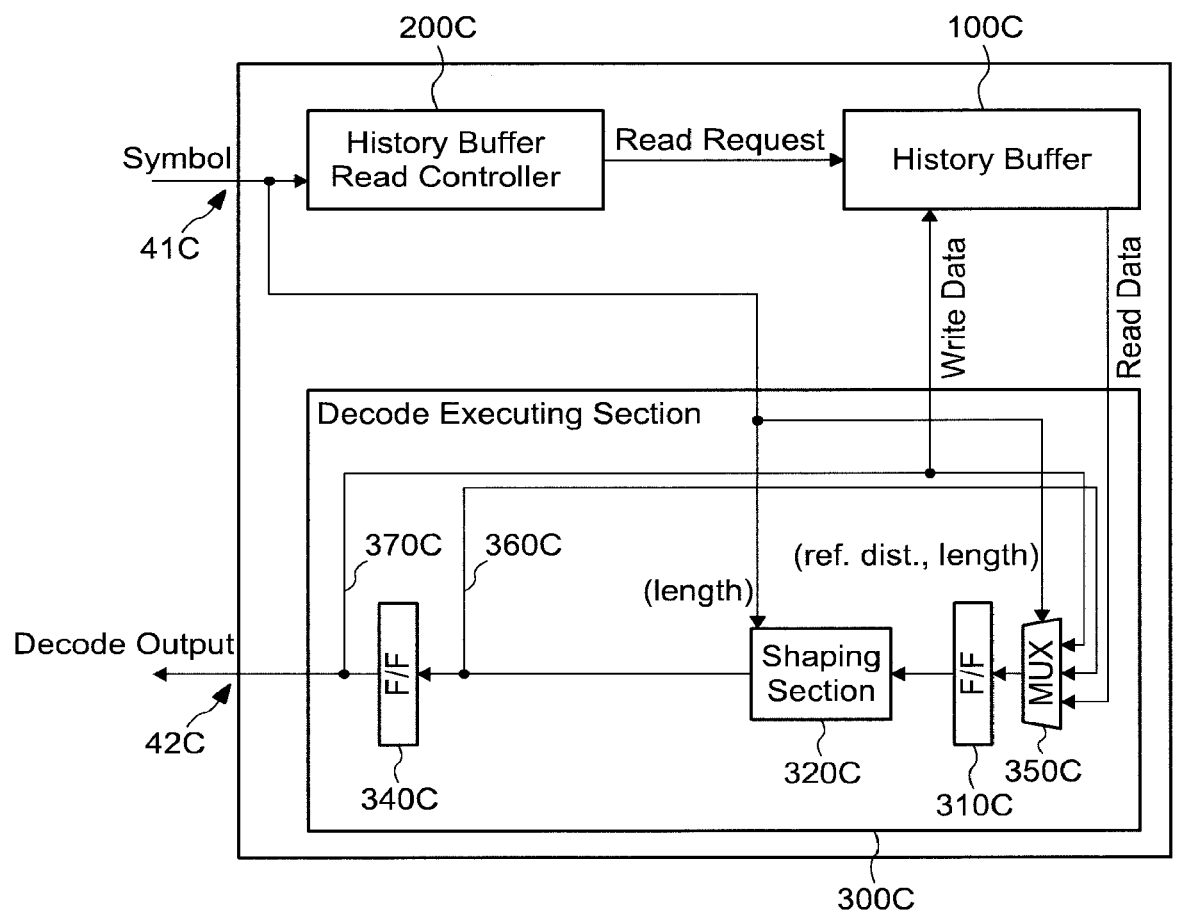
FIG. 9 is a block diagram illustrating a configuration of a decompression circuit according to an embodiment.

In the fourth embodiment, a decode executing section 300C having a configuration similar to that of the decode executing section 300 in the first embodiment is described. FIG. 9 is a block diagram illustrating the configuration of the decompression circuit according to an embodiment. The decode executing section 300C shown in FIG. 9 is similar the decode executing section 300 shown in FIG. 2, but differs from the decode executing section 300 in that bypass lines for the shaped data string are arranged instead of the intra block reference section 330 in FIG. 2. In the following description, descriptions of the same features as those of the configuration of FIG. 2 are omitted, and points mainly different from those of the configuration of FIG. 2 are described.

As shown in FIG. 9, a decode executing section 300C of a decompression circuit 40C includes an input buffer 310C, a shaping section 320C, an output buffer 340C, a multiplexer 350C (MUX), a first bypass line 360C, and a second bypass line 370C. The multiplexers 350C, the first bypass line 360C, and the second bypass line 370C may be collectively referred to as "bypass execution section". An output terminal of the history buffer 100C, the first bypass line 360C, and the second bypass line 370C are connected to an input terminal of the multiplexer 350C. An output terminal of the multiplexer 350C is connected to an input terminal of the input buffer 310C. The first bypass line 360C is connected to a line between the shaping section 320C and the output buffer 340C (or to an input terminal of the output buffer 340C). The second bypass line 370C is connected to a line between the output buffer 340C and the output terminal 42C (or the output terminal of the output buffer 340C) and to the input terminal of the history buffer 100C.

The multiplexer 350C is controlled based on the location information and the length information included in the symbol input to the input terminal 41C. That is, the multiplexer 350C selects either data string described below and transmits to the input buffer 310C based on the location information and the length information:

(1) the decoded data string read from the history buffer 100C;
(2) the shaped data string immediately after being shaped by the shaping section 320 C (input to the output buffer 340C); and
(3) the decoded data string written to the history buffer 100C (output from the output buffers 340C);

[Decode Operation of Decode Executing Section 300C]

Figure 10A:
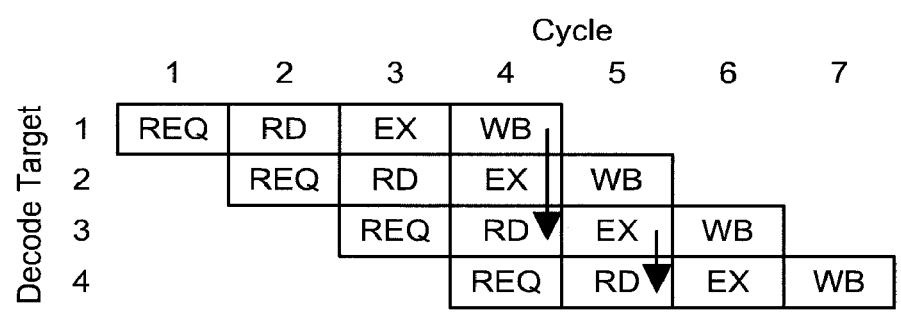
FIG. 10A is a conceptual diagram illustrating a decompression operation of a decompression circuit according to an embodiment.
Figure 10B:
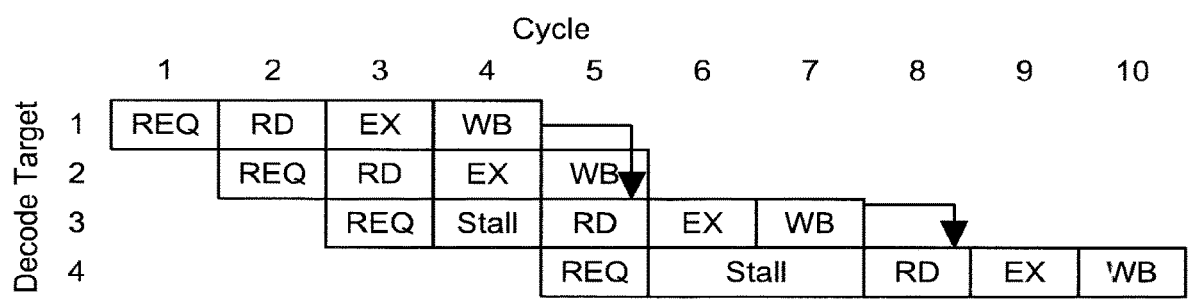
FIG. 10B is a conceptual diagram illustrating a decompression operation of a decompression circuit according to an embodiment.

FIGS. 10A and 10B are conceptual diagrams illustrating the decode operation of the decompression circuit according to the embodiment. FIG. 10A is a diagram illustrating the decode operation of the decode executing section 300C according to the fourth embodiment. FIG. 10B is a diagram illustrating the decode operation of the decompression circuit according to the comparative examples. In FIGS. 10A and 10B, the numerical values arranged vertically are the numbers for specifying the decode target, and the numerical values arranged horizontally are the order of cycles. In FIGS. 10A and 10B, the symbol of the third decode target refers to the decoded data string output at the first decode target, and the symbol of the fourth decode target refers to the decoded data string output to the third decode target.

In FIGS. 10A and 10B, the frames (stages) described as "REQ", "RD", "EX", or "WB" indicates the process contents in the respective cycles. That is, a processing of each of the stages is performed in one cycle, and processings of the stages adjacent in horizontal direction are performed in different cycle. FIGS. 10A and 10B show the operation of the four decode targets of the first decode target to the fourth decode target. In FIG. 10A, the operation of seven cycles from the first cycle to the seventh cycle is shown. In FIG. 10B, the operation of 10 cycles from the first cycle to the tenth cycle is shown. Processes belonging to the same cycle are executed at the same timing, even if the decode targets are different. For example, in FIGS. 10A and 10B, the "RD" of the first decode target and the "REQ" of the second decode target are performed in the same cycle (here, the second cycle).

The "REQ" executes the process of requesting a read from the history buffer. The "RD" stores the data string read from the history buffer in the input buffer. The "EX" executes the process of extracting a part of the data string stored in the input buffer and generates the shaped data string. The "WB" writes back the decoded data string generated as the decoded result to the history buffer.

As shown in FIG. 10B, in the decode circuit according to the comparative embodiment, when shaped data string is generated, the data string to be referred needs to be written in the history buffer. Therefore, when the "RD" (fifth cycle) is executed in accordance with the "REQ" (third cycle) of the third decode target, the "RD" needs to wait (Stall) (fourth cycle) until the "WB" (fourth cycle) of the first decode target to be read is completed. Similarly, when the "RD" (eighth cycle) is executed in accordance with the "REQ" (fifth cycle) of the fourth decode target, the "RD" needs to wait (Stall) (sixth to seventh cycle) until the "WB" (seventh cycle) of the third decode target to be read is completed. Due to the effect of the Stall, 10 cycles are required to complete the decode process for the first to fourth decode targets.

On the other hand, as shown in FIG. 9, in the decode executing section 300C according to the present embodiment, the decoded data string generated at the stage "WB" can be stored in the input buffer 310C via the second bypass line 370C and the multiplexer 350C. Therefore, as shown in FIG. 10A, the "RD" of the third decode target can be executed in the same cycle (the fourth cycle) as the "WB" of the first decode target. As shown in FIG. 9, the shaped data string generated at the "EX" stage can be stored in the input buffer 310C via the first bypass line 360C and the multiplexer 350C. Therefore, as shown in FIG. 10A, the "RD" of the fourth decode target can be executed in the same cycle (the fifth cycle) as the "EX" of the third decode target. As a result, the process can be executed without generating the Stall as shown in FIG. 10B. Therefore, the decode process for the first to fourth decode targets are completed in seven cycles.

In FIG. 10A, the above configuration can be described as follows, where the shaped data string generated in the cycle "EX" of the third decode target is the first shaped data string, and the shaped data string generated in the cycle "EX" of the fourth decode target is the second shaped data string. The bypass execution section (the multiplexer 350C and the first bypass line 360C) transmits the first shaped data string, generated by the shaping section 320C and to be output by the output buffer 340C (after the first shaped data string is generated and before the first shaped data string is output), to the multiplexer 350C between the shaping section 320C and the decode target 100 C when the second shaped data string is generated in the "EX" cycle of the fourth decode target after the first shaped data string is generated in the "EX" cycle of the third decode target, and when the data of the second shaped data string is the same as the data of the first shaped data string. Although the configuration that the first bypass line 360C and the second bypass line 370C are connected to the multiplexer 350C is exemplified in this embodiment, these bypass lines may be connected to the input buffer 310C and may be connected to other circuits arranged between the shaping section 3200 and the history buffer 100C.

The bypass execution section (the multiplexer 350C and the second bypass line 370C) transmits the decoded data string, output from the output buffer 340 and to be written to the history buffer (after the decoded data string is output and before the decoded data string is written), to the multiplexer 350 prior to the shaped section 320C when the shaped data string is generated in the "EX" cycle of the third decode target after the decoded data string is generated in the "WB" cycle of the first decode target, and the data of the shaped data string is the same as the data of the decoded data string.

As described above, the memory system 10 according to the fourth embodiment, the shaped data string can be generated by selectively using the shaped data string immediately after being generated by the shaping section 320C and the decoded data string output by the output buffers 340C and to be written back to the history buffer (before the decoded data string is written back to the history buffer). Consequently, the decode performance of the decode circuit 40C in the compression/decompression circuit 16C can be improved.

Fifth Embodiment

Figure 11:
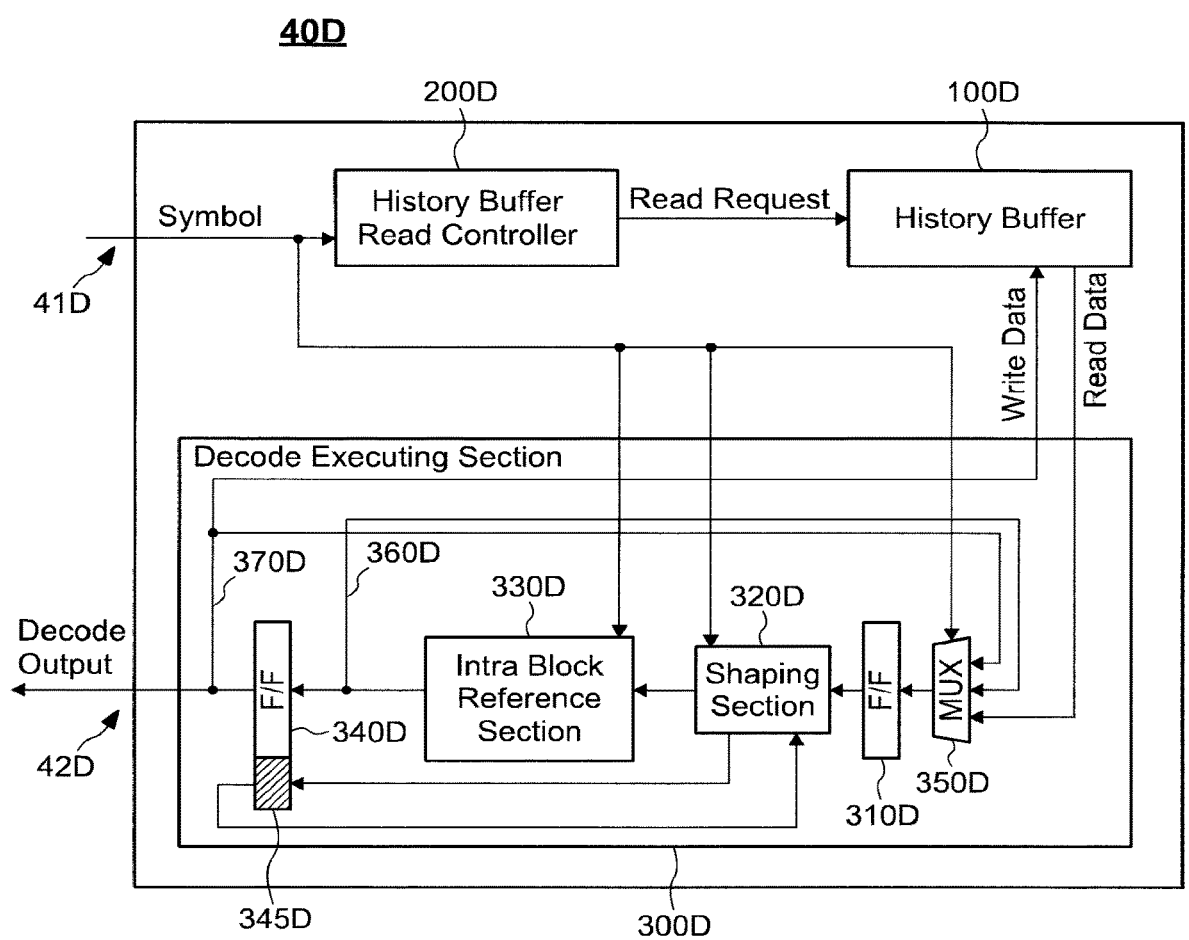
FIG. 11 is a block diagram illustrating a configuration of a decompression circuit according to an embodiment.

In the fifth embodiment, a decode executing section 300D having a configuration similar to that of decode executing section 300C in the fourth embodiment is described. FIG. 11 is a block diagram illustrating the configuration of a decompression circuit according to an embodiment. The decode executing section 300D shown in FIG. 11 is similar to decode executing section 300C shown in FIG. 9, but differs from the decode executing section 300C in that a configuration corresponding to the intra block reference section 330 of FIG. 2 is added to the decode executing section 300C of FIG. 9, and an excess output buffer 345D (F/F) is added to an output buffer 340D. In the following description, descriptions of the same configurations as those of FIGS. 2 and 9 are omitted, and mainly differences from the configurations of FIGS. 2 and 9 will be described.

[Configuration of Decode Executing Section 300D]

As shown in FIG. 11, an intra block reference section 330D is arranged between a shaping section 320D and a first bypass line 360D. The first bypass line 360D is connected to a line between the intra block reference section 330D and an output buffer 340D. The configuration of the intra block reference section 330D is the same as that of the intra block reference section 330 of FIG. 2. The excess output buffer 345D is arranged adjacent to the output buffer 340D. The excess output buffer 345D is an extension part of the output buffer 340D. That is, the output buffer 340D and the excess output buffer 345D configured by a series of consecutive buffers. An output terminal of the shaping section 320D is connected to an input terminal of the excess output buffer 345D. An output terminal of the excess output buffer 345D is connected to an input terminal of the shaping section 320D. That is, a part of the shaped data string shaped by the shaping section 320D is returned to the shaping section 320D via the excess output buffer 345D. Specifically, when the shaped data string (or the decoded result) shaped by the shaping section 320D exceeds the number of data in the output buffer 340D, one part (a first decode data) of a data string that does not exceed the number of data in the output buffer 340D is stored in the output buffer 340D, and another part (second decode data) of the data string that exceeds the number of data in the output buffer 340D is returned to the shaping section 320D via the excess output buffer 345D. The second decode data string may be called the excess data string. The first shaped data string mentioned above (to be referred data string) is included in the first decode data. The second shaped data string mentioned above (data string referring to the first shaped data string) is included in the second decode data.

Figure 12:
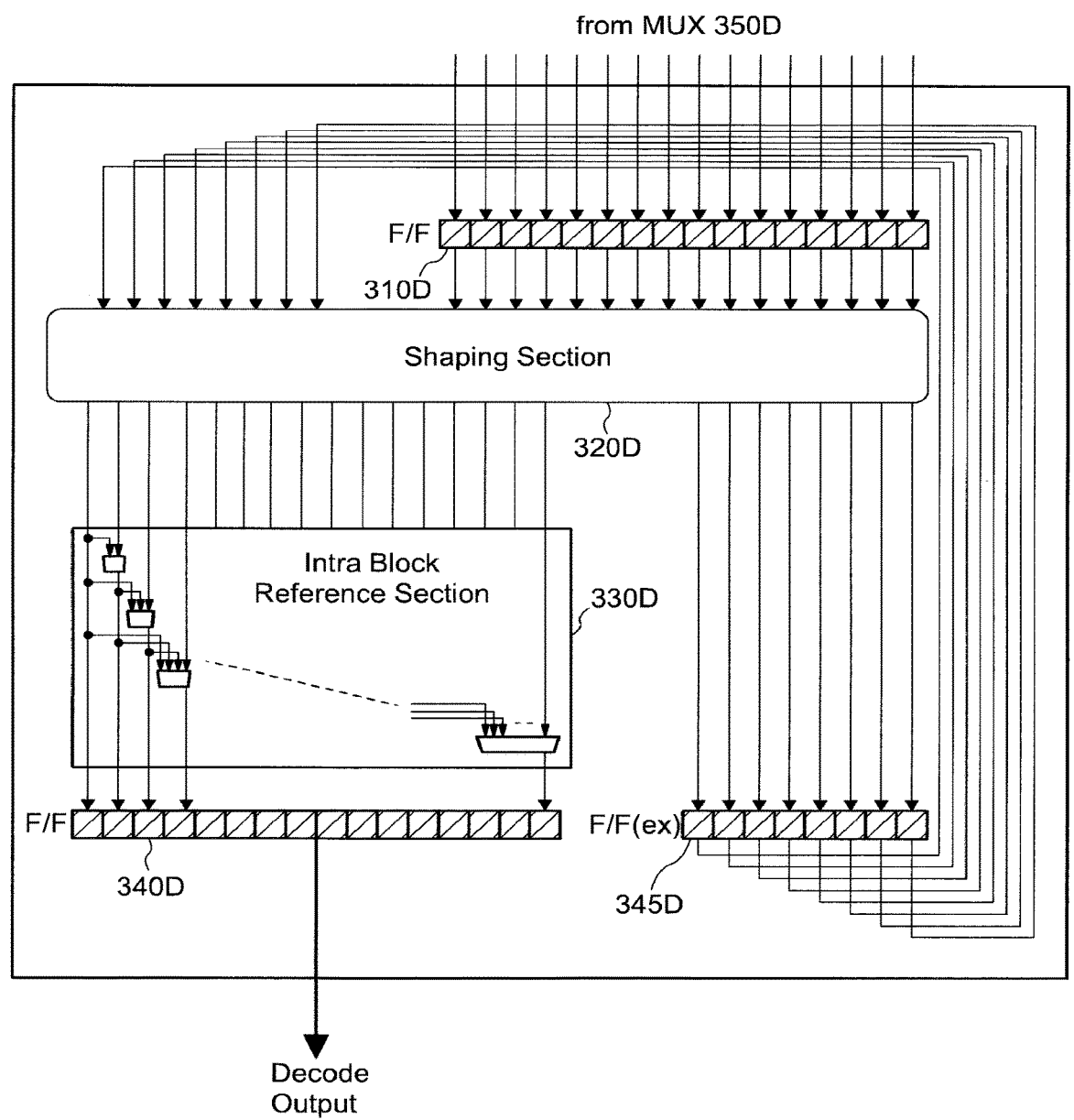
FIG. 12 is a block diagram illustrating a configuration of a decode executing section of a decompression circuit according to an embodiment.

FIG. 12 is a block diagram illustrating a configuration of a decode executing section of a decompression circuit according to an embodiment. As shown in FIG. 12, a data string output from the multiplexer 350D is input to the shaping section 320D via the input buffer 310D. In the case where the number of data output from the shaping section 320D is the same as the number of data output from the output buffer 340D or less than the number of data output from the output buffer 340D, all shaped data strings output from the shaping section 320D is input to the intra block reference section 330D, and a decoded result is generated based on the shaped data string.

On the other hand, when the number of data output from the shaping section 320D is larger than the number of data output from the output buffer 340D, an excess data string, which is a data string in the latter part of the shaped data string and a part exceeding the number of the data of the output buffer 340D, is transmitted to the excess output buffer 345D. The excess data string sent to the excess output buffer 345D is returned to the shaping section 320D in a next cycle following a present cycle in which the excess data string was input to the excess output buffer 345D. The excess data string returned to the shaping section 320D is input to the intra block reference section 330D, and a decoded result is generated based on the excess data string.

[Decode Operation of Decode Executing Section 300D]

Figure 13:
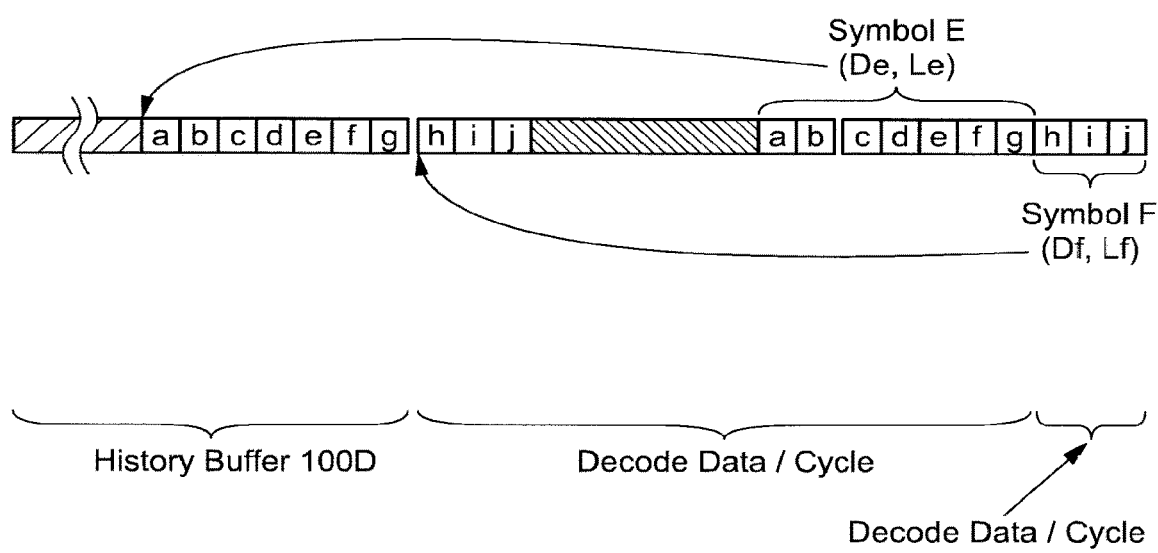
FIG. 13 is a conceptual diagram illustrating a decompression operation of a decompression circuit according to an embodiment.

FIG. 13 is a conceptual diagram illustrating a decompression operation of a decompression circuit according to an embodiment. The decode operation of FIG. 13 is realized by the decode executing section 300D of FIGS. 11 and 12. The decode operation of FIG. 13 is similar to the decode operation of FIG. 8. However, these operations are different in that the shaped data string "abcdefghij" is represented as one symbol D in FIG. 8, whereas the shaped data string "abcdefghij" is represented by two symbols, symbol E and symbol F, in FIG. 13. Specifically, in the present embodiment, the process of reading the shaped data string "abcdefghij" from the history buffer 100D is performed in two divisions.

The data string "hij . . . abcdefg" in FIG. 13 is input to the shaping section 320D in the first cycle. The data string "abcdefg" based on the symbol E in the data string mentioned above is read from the history buffer 100D. The data string "hij . . . ab" having the same number of data as the number of data of the output buffer 340D among the data string "hij . . . abcdefg" input to the shaping section 320D is transmitted to the output buffer 340D via the intra block reference section 330D. On the other hand, the data string "cdefg" which is the latter part of the data string "hij . . . abcdefg" input to the shaping section 320D is transmitted from the shaping section 320D to the excess output buffer 345D.

The data string "cdefg" stored in the excess output buffer 345D is returned to the shaping section 320D in the second cycle following the first cycle. In the second cycle, the data string "hij" based on the symbol F in FIG. 13 is input to the shaping section 320D. The data string "hij" is a data string that the data string "hij" output from the intra block reference section 330D or the output buffer 340D in the first cycle is transmitted to the multiplexer 350D via the first bypass line 360D or the second bypass line 370D. As described above, the data string "cdefg" returned from the excess output buffer 345D and the data string "hij" input from the multiplexer 350D to the shaping section 320D via the input buffer 310D are transmitted to the output buffer 340D via the intra block reference section 330D in the second cycle.

In other words, the data string "abcdefg" corresponding to the symbol E in the shaped data string is decoded using the data string "abcdefg" stored in the history buffer. The decode of the data string "hij" corresponding to the symbol F in the shaped data string is performed after the decompression of data string "abcdefg". Specifically, the decode of the data string "hij" is performed at least one cycle after a cycle in which the decode of the data string "abcdefg" is performed. In other words, a read request for the data string "hij" (second shaped data string) in the data string "cdefghij" (excess data string or second decode data string) is made after a read request for data (the data string "cdefg") other than the data string "hij" in the data string "cdefghij" is completed.

For example, in the circuits shown in FIG. 11, the path in which the data output from the input buffer 310D is input to the input buffer 310D via the shaping section 320D, the intra block reference section 330D, the first bypass line 360D, and the multiplexer 350D is a path that takes the most time in each cycle. The time at which the processing of such the path is completed is a rate-determining factor at which the processing time is determined, because it is not possible to proceed to the next cycle unless the data transfer of this path is completed. Such the path is called a critical path.

In the circuits shown in FIG. 11, if the process shown in FIG. 8 is to be performed, for example, the above-mentioned critical path occurred in order to generate the last data string "hij". On the other hand, if the processing as shown in FIG. 13 is performed, it is possible to suppress the occurrence of the critical path. Consequently, the decode performance of the decompression circuit 40D in the compression/decompression circuit 16D can be improved.

While several embodiments of the present invention have been described, these embodiments are presented as examples and are not intended to limit the scope of the present invention. For example, a person with skilled in the art can add, delete, or change design components as appropriate based on compression circuit of the present embodiment are also included in the scope of the present invention as long as they have the gist of the present invention. Furthermore, these embodiments described above can be appropriately combined as long as there is no mutual inconsistency, and technical matters common to the embodiments are included in the embodiments even if they are not explicitly described.

Even if it is other working effects which differ from the working effect brought about by the mode of each above-mentioned embodiment, what is clear from the description in this specification, or can be easily predicted by the person skilled in the art is naturally understood to be brought about by the present invention.

What is claimed is:

1. A memory system comprising:
a storage device and a memory controller configured to control the storage device, the memory controller including a decoder configured to decode a compressed data,
the memory controller including:
   a history buffer configured to store a decoded data string;
   a history buffer read controller configured to execute a read request to the history buffer; and
   a decode executing section configured to generate a first shaped data string based on the decoded data string read from the history buffer, configured to generate a second shaped data string by referring to the first shaped data string before the first shaped data string is written back to the history buffer in response to the read request, and configured to generate a decoded result using the first shaped data string and the second shaped data string,
wherein the history buffer, the history buffer read controller, and the decode executing section are provided in the decoder.

2. The memory system according to claim 1, wherein
the read request includes a location information indicating an address in the history buffer,
the decode executing section includes a shaping section and a intra block reference section,
the shaping section is configured to generate the first shaped data string based on a length information indicating the number of data from start position of the decoded data string in the address,
the intra block reference section is configured to generate the second shaped data string by referring the first shaped data string before the first shaped data string is written back to the history buffer.

3. The memory system according to claim 1, wherein
the read request includes a location information indicating an address in the history buffer,
the decode executing section includes a shaping section and a intra block reference section,
the shaping section is configured to generate the first shaped data string based on a length information indicating the number of data from start position of the decoded data string in the address,
the intra block reference section is configured to generate the second shaped data string by replicating from the first shaped data string.

4. The memory system according to claim 2, wherein
the intra block reference section is configured to generate a third shaped data string by referring the second shaped data string before the first shaped data string and the second shaped data string are written back to the history buffer, and is configured to generate the decoded result using the first shaped data string, the second shaped data string and the third shaped data string.

5. The memory system according to claim 3, wherein
the intra block reference section is configured to generate a third shaped data string by replicating from the second shaped data string, and is configured to generate the decoded result using the first shaped data string, the second shaped data string and the third shaped data string.

6. The memory system according to claim 2, wherein
the intra block reference section is configured to generate a third shaped data string by referring the first shaped data string before the first shaped data string and the second shaped data string are written back to the history buffer, and is configured to generate the decoded result using the first shaped data string, the second shaped data string and the third shaped data string.

7. The memory system according to claim 3, wherein
the intra block reference section is configured to generate a third shaped data string by replicating from the first shaped data string, and is configured to generate the decoded result using the first shaped data string, the second shaped data string and the third shaped data string.

8. The memory system according to claim 1, wherein
the read request includes a location information indicating an address in the history buffer,
the decode executing section includes a shaping section and a bypass execution section,
the shaping section is configured to generate the first shaped data string based on a length information indicating the number of data from start position of the decoded data string stored in the address,
the bypass execution section is configured to transmit the first shaped data string generated by the shaping section to a circuit between the shaping section and the history buffer in the case where the second shaped data string is generated after the first shaped data string is generated.

9. The memory system according to claim 8, wherein
the decode executing section further includes a multiplexer between the history buffer and the shaping section and an input buffer between the multiplexer and the shaping section, and
the bypass execution section is configured to transmit the first shaped data string to the multiplexer.

10. The memory system according to claim 9, wherein
the memory controller further includes an output terminal configured to output the decoded result to an external device,
the decode executing section further includes an output buffer between the shaping section and the output terminal, and
the bypass execution section includes a first bypass line and a second bypass line,
   the first bypass line is connected to a line between the shaping section and the output buffer,
   the second bypass line is connected to a line between the output buffer and the output terminal, and
   the first bypass line and the second bypass line is connected to the multiplexer.

11. The memory system according to claim 10, wherein the second bypass line is connected to the history buffer.

12. The memory system according to claim 1, wherein the memory controller further includes:
- air input buffer temporarily configured to store the decoded data string read from the history buffer and input to the decode executing section; and
- an output buffer temporarily configured to store the decoded result;

the decode executing section is configured to transmit a first part of the decoded result from the input buffer to the output buffer and is configured to transmit a second part of the decoded result from the input buffer to the output buffer after the transmitting of the first part in the case where the number of data of the decoded result exceeds the number of data of the output buffer, and is configured to generate the decoded result by combining the first part and the second part, the first part is a part where the decoded result does not exceed the number of data of the output buffer, and the second part is a part where the decoded result exceeds the number of data of the output buffer.

13. The memory system according to claim 12, wherein the decode executing section includes a shaping section, a intra block reference section and a bypass execution section, the history buffer read controller is configured to execute the read request to the second shaped data string among the second part after the read request to the other than the second shaped data string among the second part is finished in the case where the number of data of the decoded result exceeds the number of data of the output buffer, the first shaped data string referred to by the intra block reference section is included in the first part, and the second shaped data string referred to by the intra block reference section is included in the second pan.

14. A memory system comprising:
a storage device and a memory controller configured to control the storage device, the memory controller including a decoder configured to decode a compressed data, the memory controller including:
- a history buffer configured to store a decoded data string;
- a history buffer read controller configured to execute a read request to the history buffer; and
- a decode executing section including a shaping section configured to, generate a first shaped data string based on the decoded data string read from the history buffer, wherein a part of the first shaped data string generated and output by the shaping section is returned to the shaping section, and the history buffer, the history buffer read controller, and the decode executing section are provided in the decoder.

15. The memory system according to claim 14, wherein the decode executing section further includes a multiplexer between the history buffer and the shaping section and an input buffer between the multiplexer and the shaping section, and the part of the first shaped data string is transmitted to the multiplexer.

16. The memory system according to claim 15, wherein the memory controller further includes an output terminal outputting the decoded result to an external device, the decode executing section further includes an output buffer between the shaping section and the output terminal, a first bypass line connected to a line between the shaping section and the output buffer, a second bypass line connected to a line between the output buffer and the output terminal, and the part of the first shaped data string is transmitted to the multiplexer via the first bypass line and/or the second bypass line.

17. The memory system according to claim 16, wherein the second bypass line is connected to the history buffer.

* * * * *